United States Patent
Kondou et al.

(10) Patent No.: US 6,335,126 B1
(45) Date of Patent: Jan. 1, 2002

(54) METHOD OF MANUFACTURING A PELLICLE

(75) Inventors: Masahiro Kondou; Minoru Fujita; Hiroaki Nakagawa; Hiroyuki Kurata, all of Yamaguchi (JP)

(73) Assignee: Mitsui Chemicals, Inc., Tokyo (JP)

( * ) Notice: Subject to any disclaimer, the term of this patent is extended or adjusted under 35 U.S.C. 154(b) by 0 days.

(21) Appl. No.: 09/331,015

(22) PCT Filed: Dec. 16, 1997

(86) PCT No.: PCT/JP97/04640

§ 371 Date: Jun. 15, 1999

§ 102(e) Date: Jun. 15, 1999

(87) PCT Pub. No.: WO98/27460

PCT Pub. Date: Jun. 25, 1998

(30) Foreign Application Priority Data

Dec. 16, 1996 (JP) .................................................. 8-335559
May 30, 1997 (JP) .................................................. 9-141282
May 21, 1997 (JP) .................................................. 9-130840
Oct. 17, 1997 (JP) .................................................. 9-285912

(51) Int. Cl.$^7$ ........................................................ G03F 9/00
(52) U.S. Cl. .................................................. 430/5; 428/14
(58) Field of Search ........................... 430/5; 378/34, 378/35; 428/14; 355/75

(56) References Cited

U.S. PATENT DOCUMENTS 5,203,961 A    4/1993    Yen ........................... 156/645
5,769,984 A *  6/1998    Yen et al. .................... 156/73.1

FOREIGN PATENT DOCUMENTS

EP        0277820 A   8/1988
JP        2 145292    6/1990
JP        7 281421    10/1995
JP        8 95234     4/1996
JP        8 292553    11/1996

OTHER PUBLICATIONS

Patent Abstracts of Japan, vol. 018, No. 106, (P–1697), Feb. 21, 1994.

* cited by examiner

*Primary Examiner*—John A. McPherson
*Assistant Examiner*—Saleha R. Mohamedulla
(74) *Attorney, Agent, or Firm*—Biurch, Stewart, Kolasch & Birch, LLP

(57) ABSTRACT

According to the present invention, a method of manufacturing a pellicle and a jig for manufacturing a pellicle are provided. The method of manufacturing a pellicle of the present invention comprising the steps of: temporarily coating a thin film which is a constituting member of a pellicle which is a dust cover for a mask used in patterning in manufacturing a semiconductor device or a liquid crystal display plate, on a frame larger than a specified frame which is another constituting member of the pellicle; coating an adhesive on said specified frame in advance; overlapping said larger frame on said specified frame coated with said adhesive; adhering said thin film temporarily coated on said larger frame to said specified frame with said adhesive; transferring said thin film coated on said larger frame to said specified frame from said larger frame; and cutting off a portion of said transferred thin film, the portion of which is protruded from said specified frame, with a physical trimming means, wherein a coating material consisting of an organic solvent and a specified resin dissolved therein is supplied to a cut-off portion intended to be cut off, by said physical trimming means, at the same time or before cutting off said protruded thin film with said physical trimming means.

15 Claims, 7 Drawing Sheets

METHOD OF MANUFACTURING A PELLICLE

BACKGROUND OF THE INVENTION

This application is the national phase under 35 U.S.C. §371 of PCT International Application No. PCT/JP97/04640 which has an International filing date of Dec. 16, 1997 which designated the United States of America.

1. Field of the Invention

The present invention relates to a method of manufacturing a pellicle and a jig for manufacturing a pellicle.

2. Description of the Related Art

In manufacturing a semiconductor device such as an LSI and a VLSI, and a liquid crystal display plate, or the like, patterning for forming wiring called a pattern is performed by photo-irradiation onto a semiconductor wafer or an original plate for a liquid crystal display plate. During the patterning, a so-called mask (an original plate for exposure) is used, and if even a very small amount of dust is present on the mask, the dust makes an adverse effect on patterns and results in causing the semiconductor device or the liquid crystal display plate not usable.

For that reason, as well known, patterning is performed in an especially dustless room which is called a clean room. However, even in such clean room, it is still difficult to remove microscopic dust completely.

Accordingly, in order to remove dust strictly, a cover called a pellicle is attached to the surface of the mask for protecting the mask from dust.

The pellicle is a body consisting of an organic transparent thin film pasted on a specified frame, and the pasted thin film is generally called a pellicle film, and further, the specified frame on which the pellicle film is pasted is called a pellicle frame.

Although a method of manufacturing a pellicle is known as disclosed in, for example, Japanese Patent Application Laid-Open Publication No. 7-281421, this manufacturing method will be briefly described below.

(1) An organic thin film such as a nitro-cellulose, ethyl cellulose, or the like which becomes a pellicle film is temporarily attached to another frame, which is larger than the specified frame which becomes a pellicle frame, in a covered-state.

(2) An adhesive is coated on one of side edges of the specified frame.

(3) The another larger frame coated with the organic thin film of the (1) is brought to approach the adhesive-coated one edge of the (2) from above, and the organic thin film of the (1) is attached to the adhesive-coated one edge of the (2), and then the organic thin film is transferred from the another frame to the specified frame by separating the another frame from the specified frame. In this case, the organic thin film is radially protruded from the edges of the specified frame. The protruded portion is an unnecessary portion which cannot be used as the pellicle film, and non-protruded portion is an effective portion which functions as the pellicle film. Hereinafter, the unnecessary portion is referred to as "the unnecessary film" as against the pellicle film.

(4) The pellicle is formed by trimming the unnecessary film along the above-mentioned specified frame.

Meanwhile, as a means for trimming the unnecessary film, there have been known a physical method including a cutter such as a knife, a laser beam for cutting and other physical method, and a chemical method in which the unnecessary film is dissolved by a dissolving liquid.

With the physical method, although the unnecessary film can be removed within a short period of time, exceedingly minute dust such as chips, etc. will remain along the trimmed edges.

If the pellicle, in this state of having the remained dust, is used to cover a mask, it would occur that the dust drops from the pellicle, and adheres to a pattern. Then, as described above, a semiconductor device or a liquid crystal display plate becomes useless because of inferior products.

Accordingly, heretofore, efficiency of removal is enhanced by wiping the remained dust with a solvent or an adhesive tape after removing the unnecessary film with the above-mentioned method, but further efficiency of removal is demanded.

On the other hand, with the chemical method, although adverse influences by dust such as chips are not caused, it takes a long time for removing the unnecessary film in comparison with the physical method.

For that reason, there has been desired a new technology having advantages of both physical and chemical methods, in which disadvantages of both methods are eliminated.

SUMMARY OF THE INVENTION

The present invention has been made in view of the above-mentioned problems, and, therefore, an object of the invention is, in manufacturing a dust cover, namely, a pellicle, for a mask being used in a so-called in patterning in manufacturing a semiconductor device, a liquid crystal display plate and the like, to provide a method of manufacturing a pellicle and a jig for trimming an unnecessary film, whereby exceedingly minute dust such as chips, etc. which is produced in a process of cutting off the unnecessary film, can be suppressed as much as possible, and the cutting-off process can be accomplished within a short period of time.

A method of manufacturing a pellicle according to the present invention is:

(1) a method of manufacturing a pellicle comprising the steps of:

temporarily coating a thin film, which is a constituting member of a pellicle which is a dust cover for a mask used in patterning in manufacturing a semiconductor device or a liquid crystal display plate, on a frame larger than a specified frame which is another constituting member of the pellicle;

coating an adhesive on the specified frame in advance;

overlapping said larger frame on the specified frame coated with said adhesive;

adhering the thin film which has been temporarily coated on said larger frame to the specified frame by the adhesive;

transferring the thin film coated on the larger frame to the specified frame from the larger frame; and removing a portion of the transferred thin film, the portion which is protruded from the specified frame, with a physical trimming means, and wherein a coating material, consisting of an organic solvent and a specified resin dissolved therein, the coating material which is a thermo-setting type adhesive or an ultraviolet curing type adhesive which can suppress dust produced in cutting off the thin film and make not to remove the dust from the thin film, is supplied to a cut-off portion which is intended to be cut off, by said physical trimming means, at the same time or before cutting off the thin film with the physical trimming means.

Accordingly, with the method of manufacturing a pellicle of the present invention, before removing the protruded portion of the thin film transferred to the specified frame with the physical trimming means, the cut-off portion intended to be cut off is coated with the coating material. Consequently, even though exceedingly minute dust(s) is (are) produced in a trimmed portion of the thin film, the minute dust(s) is(are) mixed with the coating material, thereby the dust cannot move due to an adhesive force of the coating material. Thus, the minute dust comes into a state that it is attached to the trimmed portion of the thin film. Therefore, it is possible to suppress to the utmost drop of the minute dust such as chops onto a pattern. Further, the protruded portion is removed by the physical trimming means, and trimming work can be finished within a short period of time.

The method of manufacturing a pellicle may be carried out in the following modes.

(2) The coating material is a thermo-setting type adhesive or an ultraviolet curing type adhesive which is applied to and covering a cutting surface of the thin film, thereby to suppress dust produced in cutting off the thin film with the physical trimming means and not to remove the dust from the cut thin film.

(3) The coating material is a saturated solution which consists of a specified organic solvent and a specified resin saturatedly dissolved therein.

(4) The resin contained in the coating material is immersed in the organic solvent for at least five hours or longer, and, preferably, 12 hours or longer at a temperature in the range of 20–25° C.

(5) The saturated solution contains the resin at a ratio of 1–20 parts by weight, preferably 2–9 parts by weight, based on 100 parts by weight of the organic solvent.

(6) The resin is a resin material which is identical or similar to the material of the thin film.

(7) The resin is a resin material selected from a cellulose derivative, a silicone resin, an epoxy resin, an acrylic resin, and a fluorine-containing resin.

(8) The organic solvent is a solvent selected from a ketone solvent, a low fatty acid ester solvent, and a mixed solvent composed of a ketone or ester and isopropyl alcohol.

For the ketone solvent, there are exemplified methyl ethyl ketone, methyl isobutyl ketone, acetone, and the like.

For the low fatty acid ester solvent, there are exemplified butyl acetate, isobutyl acetate, and the like.

In the case where a fluorine-containing resin is used, the organic solvent may be a fluorine solvent, such as CT-100, CT-130, CT-160, and CT-180 (all of which are the product names) manufactured by Asahi Glass Co. Ltd.; EF-L102, EF-L155, EF-L174, and EF-L215 (all of which are the product names) manufactured by Tochem Products Co. Ltd.; and IL-260 and IL-263 (all of which are the product names) manufactured by Tokuyama Co. Ltd.

(9) When the resin is a fluorine-containing resin, a fluorine solvent is used as the organic solvent.

(10) The coating material is continuously supplied by means for supplying the coating material attached to or incorporated in the physical trimming means.

(11) The coating material is applied to the cut-off portion intended to be cut off, by the means for supplying the coating material.

(12) The coating material is discharged to the cut-off portion intended to be cut off, by the means for supplying the coating material.

(13) A pipe body is used for the means for supplying the coating material.

(14) When the physical trimming means is moved in a direction for cutting off the thin film, the coating material is supplied at a position where the physical trimming means comes in contact with the thin film or from above that position.

(15) A blade or a needle is used for the physical trimming means.

(16) The blade has a single edge or a double edge which can cut the thin film along the specified frame. It is preferable that the blade is of a thin-blade sharp edge type.

(17) The needle is a needle with its head obliquely cut.

On the other hand, a jig is required for manufacturing a pellicle, and the jig used in the method of manufacturing a pellicle according to the present invention will be described below.

(18) A jig used in a method of manufacturing a pellicle comprising the steps of: temporarily coating a thin film, which is a constituting member of a pellicle which is a dust cover for a mask used in patterning in manufacturing a semiconductor device or a liquid crystal display plate, on a frame larger than a specified frame which is another constituting member of the pellicle; coating an adhesive on the specified frame in advance; overlapping said larger frame on the specified frame coated with the adhesive; adhering the thin film which has been temporarily coated on the larger frame to the specified frame by the adhesive; transferring the thin film which has been temporarily coated on the larger frame to the specified frame from the larger frame; and removing a portion of the transferred thin film, the portion which is protruded from the specified frame, with a physical trimming means.

Specifically, the jig is characterized in that it includes a coating material supply means for supplying the coating material, which consists of an organic solvent and a resin dissolved therein, to a cut-off portion which is intended to be cut off from the thin film, at the same time or before cutting off the thin film with the physical trimming means.

Accordingly, with the jig used in the method of manufacturing a pellicle of the present invention, before removing the protruded portion of the thin film transferred to the specified frame body with the physical trimming means, the cut-off portion intended to be cut off is coated with the coating material supplied by the means for supplying the coating material. Accordingly, even though exceedingly minute dust is produced in the cut-off portion of the thin film by cutting off, the minute dust is mixed with the coating material, and placed in a state that the dust cannot be removed from the cut off thin film due to an adhesive force of the coating material. Thus, the minute dust remains attached to the cut off portion of the thin film. Therefore, it is possible to suppress to the utmost dropping of the minute dust such as chops onto a pattern as in the conventional art. Further, since the protruded portion of the thin film is removed by the physical trimming means, a trimming work can be finished within a short period of time.

The jig used in the method of manufacturing a pellicle according to the present invention may also be configured as follows.

(19) The means for supplying the coating material is fitted to the physical trimming means.

(20) The means for supplying the coating material is a pipe body.

(21) The physical trimming means is a blade.

(22) The blade has a single edge or a double edge which can cut the thin film along the specified frame.

(23) The physical trimming means is a needle.

(24) The needle is a needle with its head obliquely cut.

(25) The needle is attached to the jig body, and a discharging port for discharging the coating material is formed in a root portion of the needle in the jig body.

(26) The coating material is a thermo-setting type adhesive or an ultraviolet curing type adhesive which is applied to and covering the cutting surface of the thin film, thereby to suppress dust produced in cutting off the thin film with the physical trimming means and not to remove the dust from the thin film.

(27) The coating material is a saturated solution consists of a specified organic solvent and a specified resin saturatedly dissolved therein.

(28) The resin contained in the coating material is immersed in the organic solvent for at least five hours or longer, preferably, 12 hours or longer at a temperature in the range of 20–25° C.

(29) The saturated solution contains the resin at a ratio of 1–20 parts by weight, preferably 2–9 parts by weight, based on 100 parts by weight of the organic solvent.

(30) The resin is a resin material which is identical or similar to the material of thin film.

(31) The resin is a resin material selected from a cellulose derivative, a silicone resin, an epoxy resin, an acrylic resin, and a fluorine-containing resin.

(32) The organic solvent is a solvent selected from a ketone solvent and a low fatty acid ester solvent, when the resin is a cellulose derivative, a silicone resin, an epoxy resin or an acrylic resin.

(33) When the resin is a fluorine-containing resin, a fluorine solvent, such as, as described in (8) above is used as the organic solvent.

(34) The coating material is coated on the cut-off portion intended to be cut off, by the means for supplying the coating material.

(35) The coating material is discharged to the cut-off portion intended to be cut off.

DESCRIPTION OF THE PREFERRED EMBODIMENTS

Figure 1:
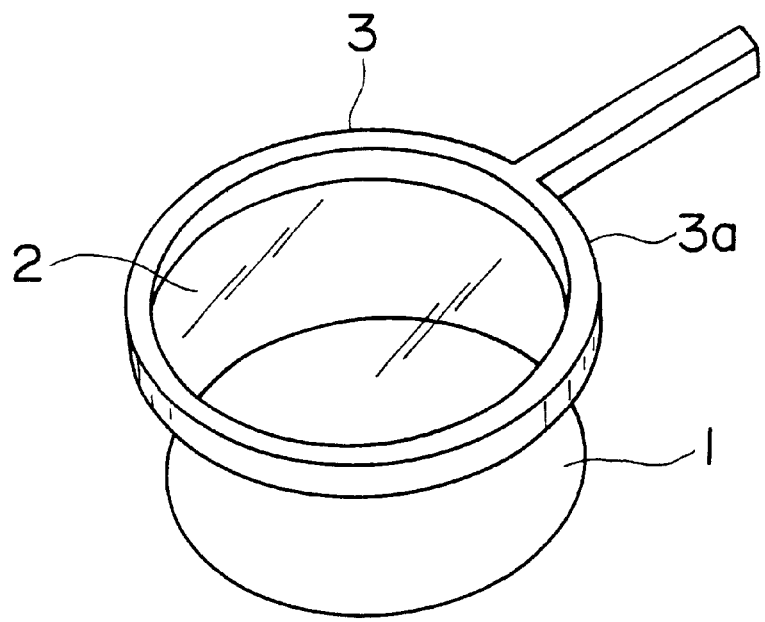
FIG. 1 is a perspective view showing a state of an organic thin film, which is to become a pellicle film, being temporarily attached to a frame larger than a specified frame which is to become a pellicle frame.

Hereinafter, preferred specific embodiments of the present invention will be described with reference to the accompanying drawings. (Mode of Embodiment)

First of all, the description will be made by referring to FIGS. 1–6.

A pellicle film which is a constituting element of a pellicle is originally a thin film formed on a quartz base plate 1, and the thin film is designated by reference numeral 2.

The thin film 2 is peeled from the quartz base plate 1 by a film peeling jig 3, and it is temporarily placed on a circle frame 3a of the film peeling jig 3 in a state of adhesion thereto.

Figure 2:
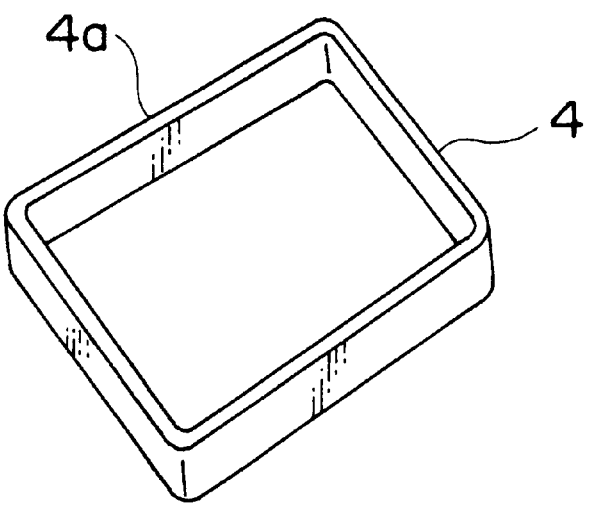
FIG. 2 is a perspective view of the pellicle frame.
Figure 6:
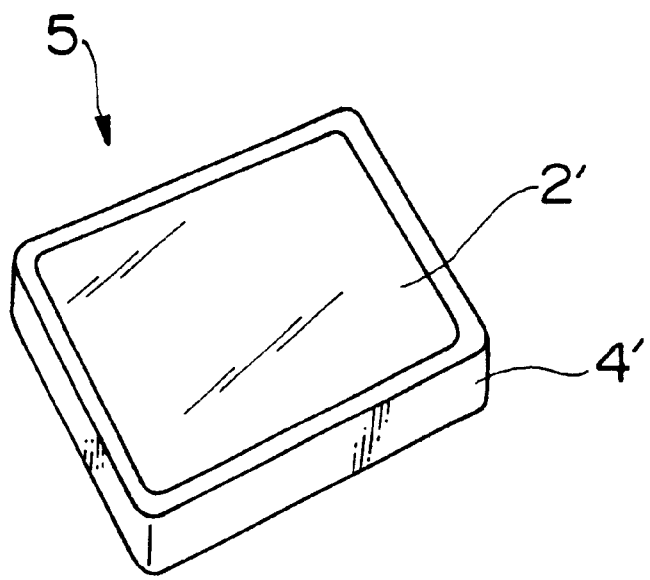
FIG. 6 is a perspective view showing an entire view of a pellicle manufactured by the use of the method of manufacturing a pellicle and the jig for manufacturing a pellicle according to the present invention.

And, the peeled thin film 2 is stretched on a rectangular frame 4 as shown in FIG. 2, and when an extra portion of the thin film 2 is removed, a pellicle 5 is provided which comprises pellicle frame 4' which is the frame body 4 and a pellicle film 2' which is the original thin film 2 as shown in FIG. 6.

It is to be noted that an adhesive is applied in advance to an upper edge 4a of the frame body 4 shown in FIG. 2, and when the thin film 2, which has been temporarily adhered to the circle frame 3a, is overlapped on the upper fringe 4a, the thin film 2 is adhesively fixed to the upper edge 4a by the above-mentioned adhesive.

Further, the reason for cutting off the extra portion of the thin film 2 described above is that, as seen in FIG. 3, in comparing the circle frame 3a of the film peeling jig 3 and the frame body 4, the film peeling jig 3 is larger, and when the circle frame 3a with the thin film 2 adhered thereto is placed over the frame body 4, the thin film 2 protrudes from the frame body 4, and a protruded portion is unnecessary. The protruded portion is unnecessary portion as a pellicle film, and the unnecessary film is denoted by reference numeral 6. Further, the non-protruded portion is an effective portion as the pellicle film, and it is denoted by reference numeral 2' as stated above.

Figure 3:
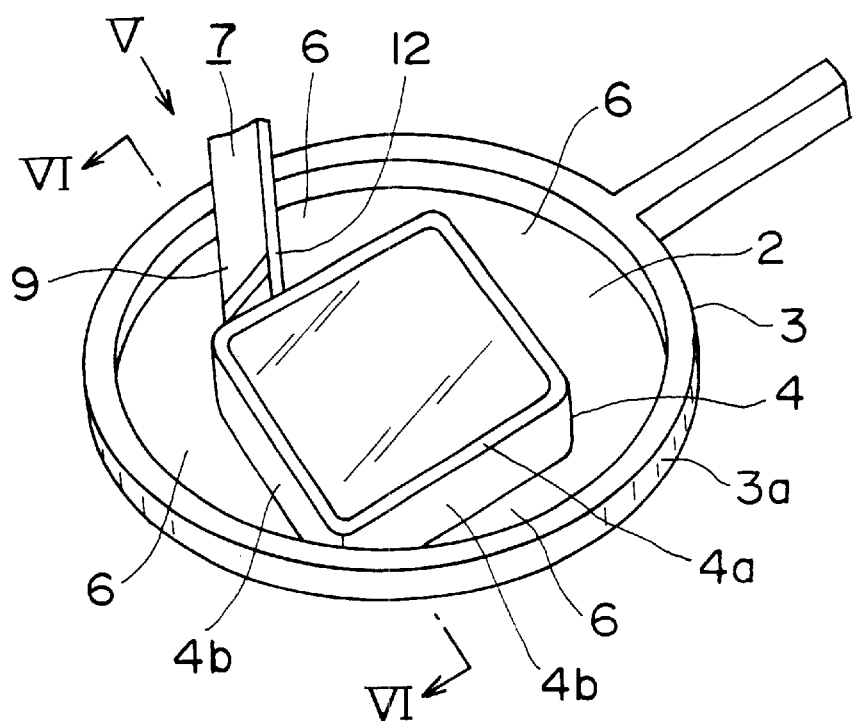
FIG. 3 is a perspective view showing a state in which the unnecessary film protruded from the pellicle frame is removed by using the jig for manufacturing a pellicle according to the present invention.

And, in order to remove the unnecessary film 6, a jig which is denoted by reference numeral 7 in FIG. 3 is the pellicle manufacturing jig 7 according to the present invention, and a method of manufacturing a pellicle using the pellicle manufacturing jig 7 is the method of manufacturing a pellicle according to the present invention.

Figure 4:
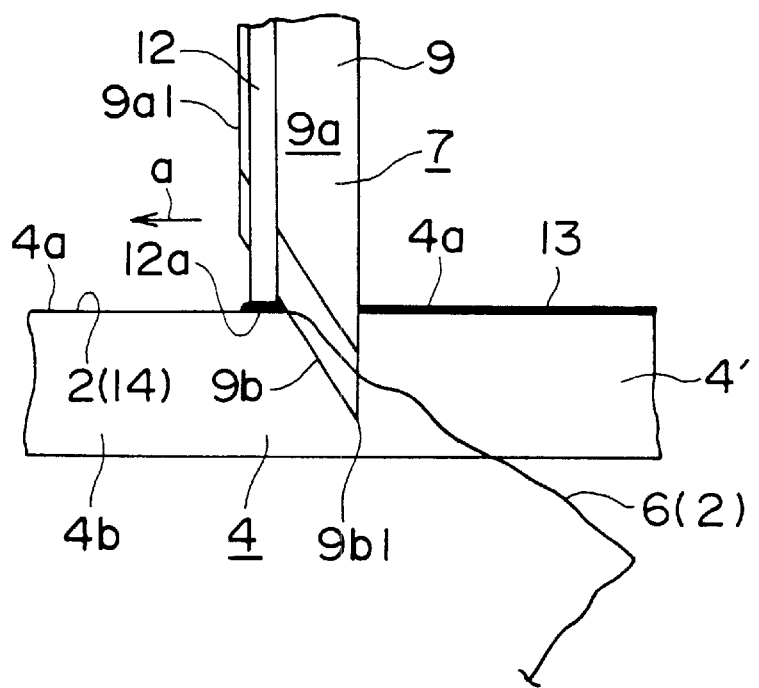
FIG. 4 is a view of FIG. 3 which is viewed from a direction of an arrow mark V.

The pellicle manufacturing jig 7 is, as shown in FIG. 4, comprising a blade 9 and a pipe 12 integrated with the blade 9 and serves as a means for supplying a coating material.

The blade 9, as a cutting means, cuts off directly the unnecessary film 6, and is held by an unillustrated robot hand, and it can be freely moved by the robot hand. For the blade 9, use of a thin blade which has a single edge or a double edge is preferable as it enables cutting off the unnecessary film 6 of the thin film 2 protruded from the frame body 4, along the edges of the frame body 4, easily. A preferable blade having a single edge is exemplified by a Mat Cutter (product name) by Olfa Co. Ltd. Further, a preferred blade having a double edge is exemplified by a Design Knife (product name) and a Circle Edge (product name), both by Olfa Co. Ltd., and a Surgical Bladies (product name) by Feather Co. Ltd., and the like.

The pipe 12, as shown in FIG. 4, is integrally combined with the blade 9 at a portion along one side 9a1 of the center body 9a of the blade 9, in such a manner that an open end 12a of the pipe 12 is directed to a point 9b1 of the blade 9, and attached to a position which is deeper than the point 9b1 in a longitudinal direction of the blade 9.

The pipe 12 supplies a coating material 13 at a cut-off portion 14 (refer to FIG. 4) intended to be cut off from the thin film 2 at the same time with or before removing the unnecessary film 6 by the blade 9, and, for this purpose, it is connected with an unillustrated coating material supply tank. The cut-off portion 14 intended to be cut off is a portion of the thin film 2, the portion which is in contact with the upper edge 4a and disposed along outer edges 4b of the frame body 4.

The coating material 13 is a saturated solution consisting of an organic solvent and a specified resin which is saturatedly dissolved in the organic solvent. Use of the saturated solution provides a fine finishing, since cutting off of the thin film by the solvent is not performed and coating the cut surface with the resin is performed with certainty.

For the specified resin which is a raw material for the coating material 13, and a resin which is an identical material to the thin film 2 or a resin composed of a similar material to the thin film 2 is used, for example, a cellulose derivative, a silicone resin, an epoxy resin, an acrylic resin, and a fluorine-containing resin may be used. For the cellulose derivative, a nitrocellulose or a cellulose propionate, or the like is preferable. Further, for the fluorine-containing resin, a CYTOP (product name) and a Teflon AF (product name), both of Asahi Glass Co., Ltd. In the case wherein a resin which is identical or a similar material to the thin film 2 is used, the resin is easy to be fused with the thin film 2, resulting in that coating is performed with certainty.

Further, for the organic solvent in which the resin for the coating material 13 is dissolved, a solvent such as a fluorine solvent, a ketone solvent, a low fatty acid ester solvent, or a mixed solvent composed of a ketone or ester and isopropyl alcohol, may be used. For the ketone solvent, for example, methyl ethyl ketone, methyl isobutyl ketone, acetone, and the like, may be used. For the low fatty acid ester solvent, butyl acetate, isobutyl acetate, and the like are exemplified.

In the case where the fluorine-containing resin is used as a resin for the coating material, a fluorine solvent is used. Specifically, a solvent of fluorocarbon, such as CT-100, CT-130, CT-160, and CT-180 (all of which are the product names) manufactured by Asahi Glass Co., Ltd., and EF-L102, EF-L155, EF-L174, and EF-L215 (all of which are the product names) manufactured by Tochem Products Co., Ltd., IL-260 and IL-263 (all of which are the product names) manufactured by Tokuyama Co., Ltd.

Cutting off of the unnecessary film 6 using the pellicle manufacturing jig 7 is performed as follows.

Figure 5:
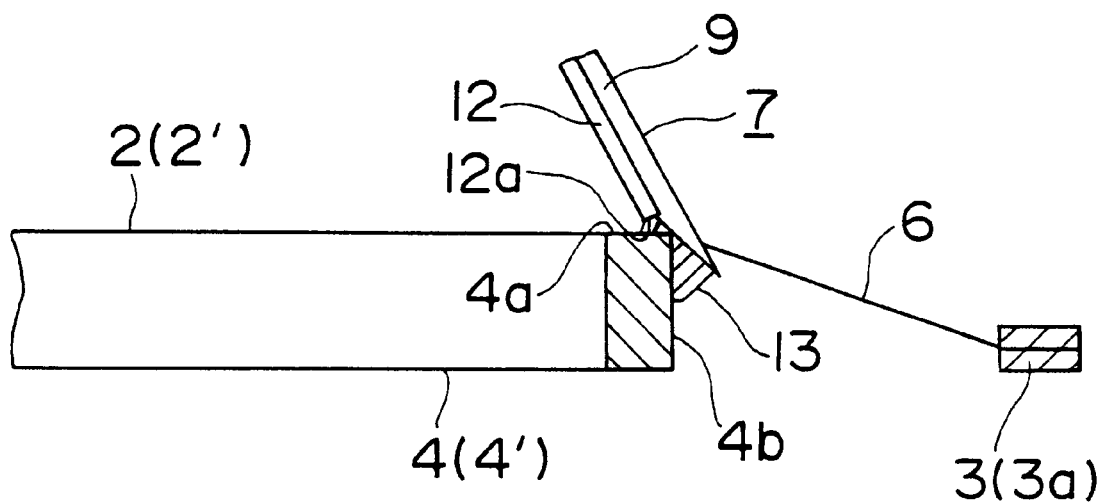
FIG. 5 is a partially-omitted sectional view taken along a phantom plane line including the line VI—VI of FIG. 3 and viewed in a direction of an arrow mark.

As can be understood from FIGS. 3, 4, and 5, when the thin film 2 is stretched over the frame body 4 by using the film peeling jig 3, the point 9b1 of the cutting edge 9b of the blade 9 is pressed onto the thin film 2 which is positioned outside of the frame body 4, the cutting edge 9b is thrust until it arrives at the open end 12a of the pipe 12, and, in this state, the blade 9 is moved in a direction of an arrow mark "a" in FIG. 4 along the outer edges of the frame body 4. At this time, the open end 12a of the pipe 12 is in contact at all times with the cut-off portion 14 intended to be cut off from the thin film 2, and a fixed amount of the coating material 13 is discharged from the open end 12a, while making an advance movement in the moving direction of the blade 9. Accordingly, the cut-off portion 14 intended to be cut off is placed in a state of being coated with the coating material 13. Then, by moving the blade 9 along the cut-off portion of the thin film 2 coated with the coating material 13, the unnecessary film 6 which is the unnecessary portion of the thin film 2 is cut off by the cutting edge 9b.

As described above, in cutting the thin film 2, the blade 9 cuts off the cut-off portion 14 intended to be cut off on which the coating material 13 is coated, and, thus, even when exceedingly minute dust is produced by cutting off, the minute dust is mixed with the coating material 13, and the dust becomes unable to move due to an adhesive force of the coating material 13. By this reason, the minute dust is placed in a state of being adhered to the cut off portion of the thin film 2. Thus, dropping of the minute dust, such as, chops produced by the blade 9, onto a pattern is suppressed to the utmost extent.

Further, since the unnecessary film 6 of the thin film 2, that is the portion which is protruded from the frame body 4, is removed by the blade 9 which is a physical trimming means, the cutting work can be finished within a short period of time.

Still further, since the blade 9 and the pipe 12 are integrally formed together, it is by far effective than moving them separately by hands of individual robots.

Modification Example 1

Next, a modification example 1 of the pellicle manufacturing jig 7 will be described by referring to FIGS. 7 and 8.

Numeral 7A denotes a pellicle manufacturing jig of the modification example 1.

The pellicle manufacturing jig 7A is different from the pellicle manufacturing jig 7 in that the jig 7A uses a needle, instead of a blade, as the physical trimming means, the coating material is discharged from the root of the needle, and other matters relating thereto.

The pellicle manufacturing jig 7A comprises a pipe body 20 having a large diameter which is a main portion, and a needle 22 which is the physical trimming means disposed at a forward end of the pipe body. In comparing the pipe body 20 and the needle 22, the pipe body 20 is more than 10 times larger than the needle 22, and a connecting portion 24 between the pipe body 20 and the needle 22 has a flat conical shape as shown in FIGS. 7 and 8. Further, the jig has a shape in which a needle 21 projects at a top point of the connecting portion 24.

Still further, at least one or more discharging ports 26 for discharging the coating material 13 are disposed around the needle 21 in the connecting portion 24.

Figure 7:
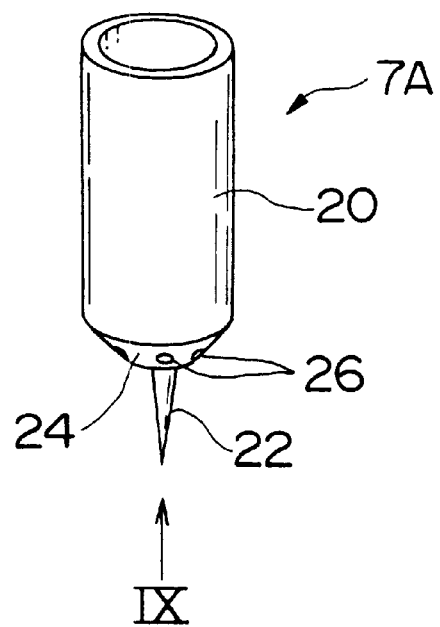
FIG. 7 is a perspective view of a first modification example of the jig for manufacturing a pellicle according to the present invention.
Figure 8:
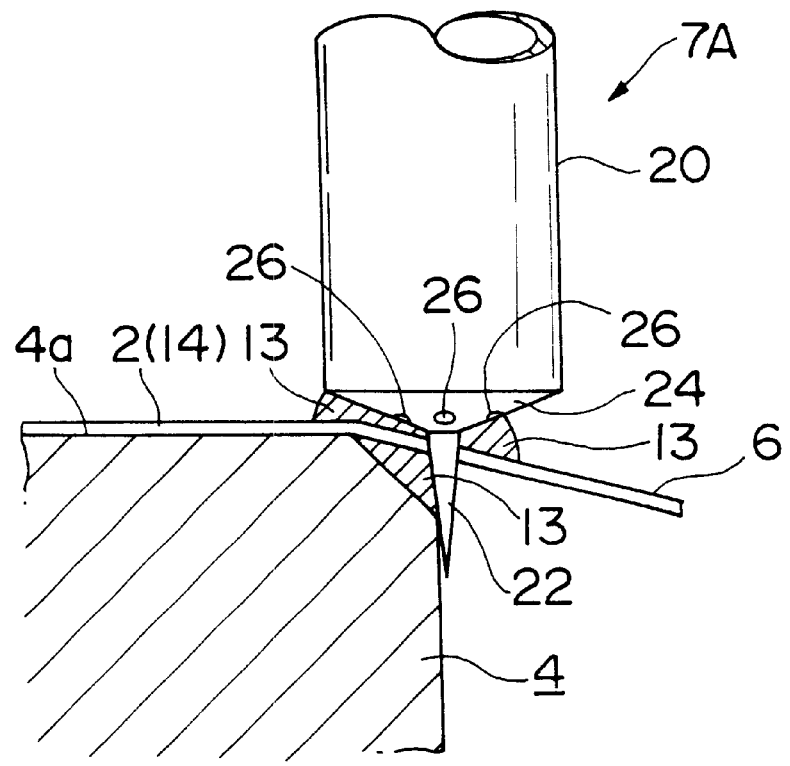
FIG. 8 is an enlarged side view of FIG. 7.

In the modification example 1, as can be seen from FIGS. 7 and 8, a total of three discharging ports 26, 26, and 26, are formed, that is, one at a front side in a moving direction of the needle 21 and one each at both sides of moving direction of the needle 21, respectively.

Figure 9:
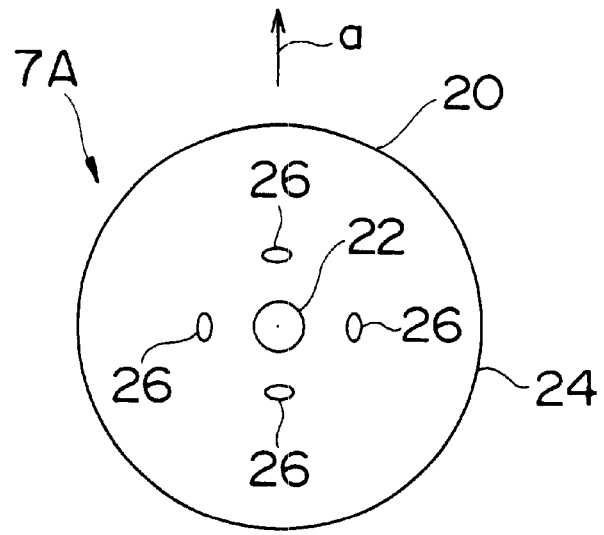
FIG. 9 shows another embodiment of the first modification example of the jig for manufacturing a pellicle according to the present invention, in which the jig for manufacturing a pellicle is viewed from a direction of an arrow mark IX in FIG. 7.

Further, as shown in FIG. 9, the discharge ports may also be arranged in the number of total four discharging outlets 26, 26, 26, and 26, that is, one each at both sides, and front and back of moving direction of the needle 21, respectively, at an equal interval.

As described above, in the case where a plurality of discharging ports are arranged at an equal interval around the needle 21 in such a manner that the discharging ports 26 are disposed at positions preceding the moving of the needle 21 in a moving direction thereof, it is not required to operate the pellicle manufacturing jig by the unillustrated robot handles to direct the jig to a position so as to have the discharge port 26 placed at a position preceding the moving of the needle 21 in its moving direction of the needle 21.

In the case where the thin film 2 is cut off by using the pellicle manufacturing jig 7A, the needle 22 is thrust until it reaches the connecting portion 24 of the pipe body 20, and while maintaining this state, the needle 22 is moved along the outer edge of the frame body 4 in the same direction as indicated by the arrow mark "a" in FIG. 4. At this time, the respective discharging ports 26 are in contact with the cut-off portion 14 intended to be cut off from the thin film 2, or in the vicinity of the above that portion, and the discharging ports discharge a fixed amount of the coating material 13 while preceding the moving of the needle 22 in its moving direction. Accordingly, the cut-off portion 14 intended to be cut off is coated with the coating material 13. When the needle 22 moves along the cut-off portion 14 of the thin film 2 which has been coated with the coating material 13, the unnecessary film 6 which is an unnecessary portion of the thin film 2 is severed by the needle 22.

As described above, in cutting off the thin film 2, since the needle 22 cuts off the cut-off portion 14 intended to be cut off which is coated with the coating material 13, even when exceedingly minute dust is produced in the cut off thin film 2 by cutting thereof, the minute dust is mixed with the coating material 13, and it becomes unable to move due to an adhesive force of the coating material 13. Thus, the minute dust is in a state of being adhered to the cut off portion of the thin film 2. As a result, dropping of the minute dust, such as, chops, produced by the needle 22 onto a pattern can be suppressed to the utmost extent. Further, since the portion of the thin film 2 protruded from the frame body 4 is removed by the needle 22 which is the physical trimming means, the cutting work can be finished within a short period of time.

In the modification example 1, the connecting portion 24 is shown as the flat conical shape, but it is not necessary to limit the shape thereto. A flat conical shape having a stepped taper form may also be used.

Figure 10:
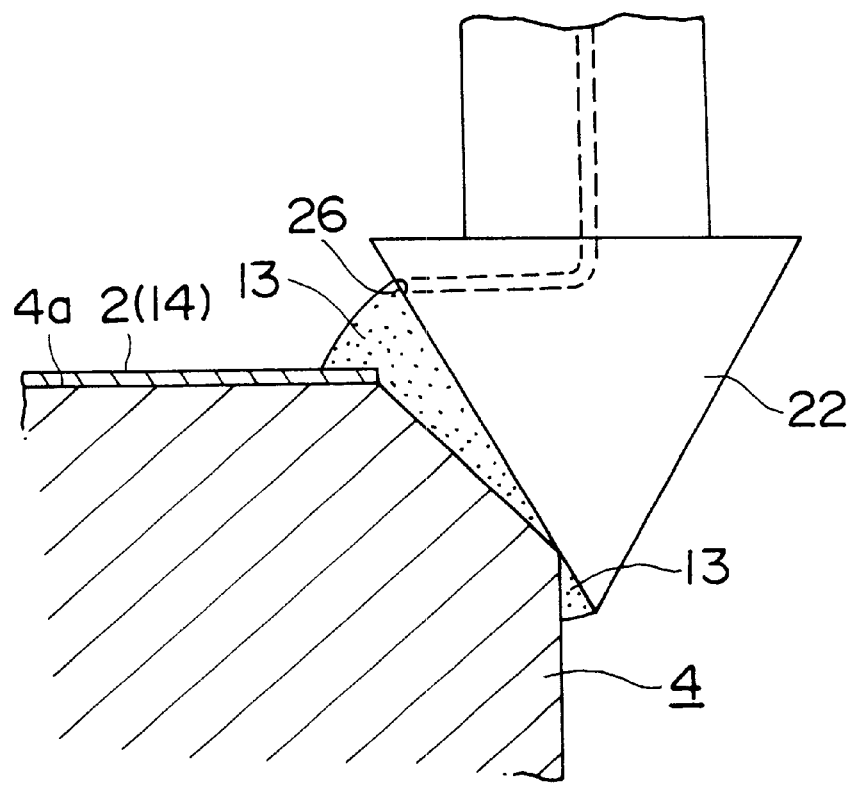
FIG. 10 shows another embodiment of the first modification example of the jig for manufacturing a pellicle according to the present invention.
Figure 11:
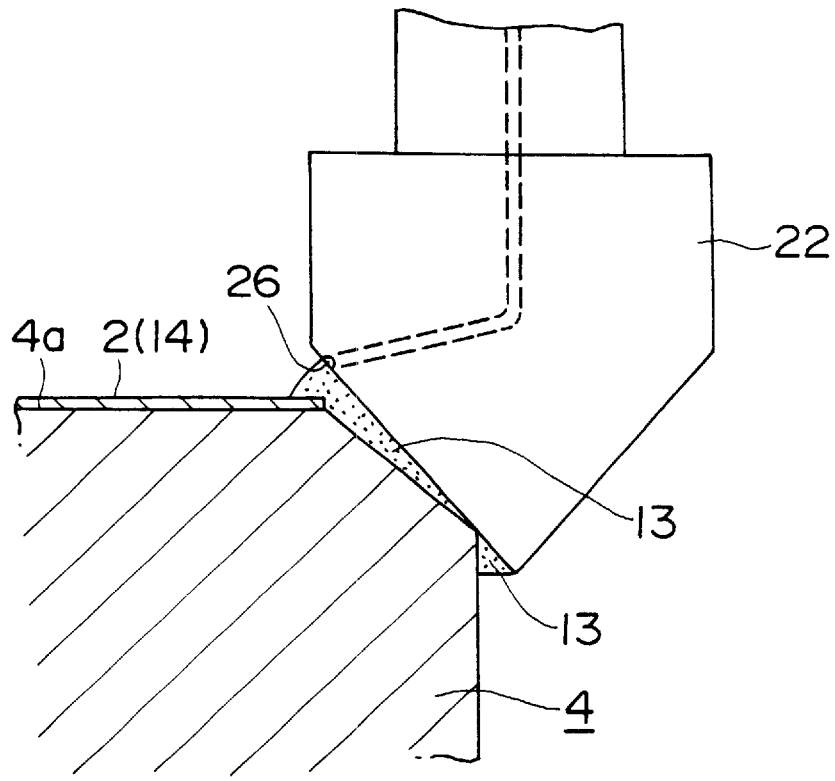
FIG. 11 shows still another embodiment of the first modification example of the jig for manufacturing a pellicle according to the present invention.
Figure 12:
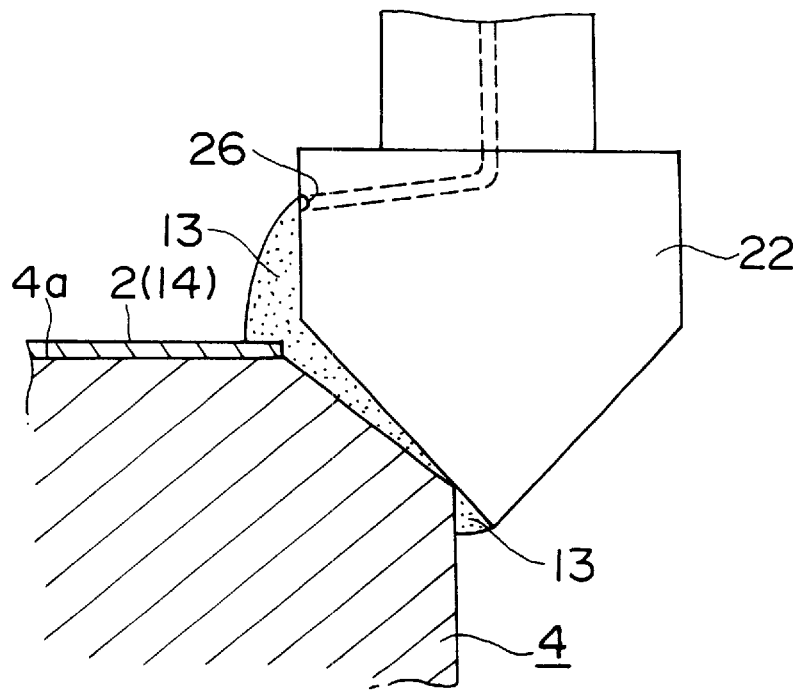
FIG. 12 shows still further another embodiment of the first modification example of the jig for manufacturing a pellicle according to the present invention.

Further, the forward end of the needle 22 may be formed in a regular triangle-shape as shown in FIG. 10, or in the form of a baseball home base as shown in FIGS. 11 and 12.

Still further, the forward end of the pipe body 20 may be formed in shapes as shown in FIGS. 10–12 in place of the tip of the needle 22.

The difference between FIG. 11 and FIG. 12 is that, in FIG. 11, the discharging port 26 for discharging the coating material 13 is located lower than the discharge port 26 in FIG. 12. However, the discharging ports 26 are so disposed to be above the cut-off portion 14 intended to be cut off in all cases.

Modification Example 2

Figure 13:
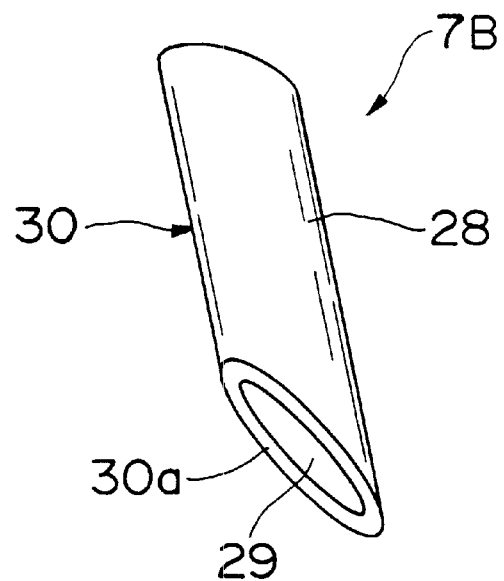
FIG. 13 shows a second modification example of the jig for manufacturing a pellicle according to the present invention.

Next, a modification example 2 of the pellicle manufacturing jig 7 will be described with reference to FIGS. 13 and 14.

Numeral 7B denotes a pellicle manufacturing jig of the modification example 2.

The pellicle manufacturing jig 7B is different from the pellicle manufacturing jig 7 in that, with the jig 7B, a pipe with its forward end being obliquely cut so as to have a shape like a syringe needle is used as the physical trimming means for discharging the coating material, and other matters relating thereto.

The pellicle manufacturing jig 7B comprises a pipe 30 with a tip 30a being formed like a syringe needle, thereby this jig 7B serves both as coating material supply means and a cutting edge for cutting off the thin film.

Figure 14:
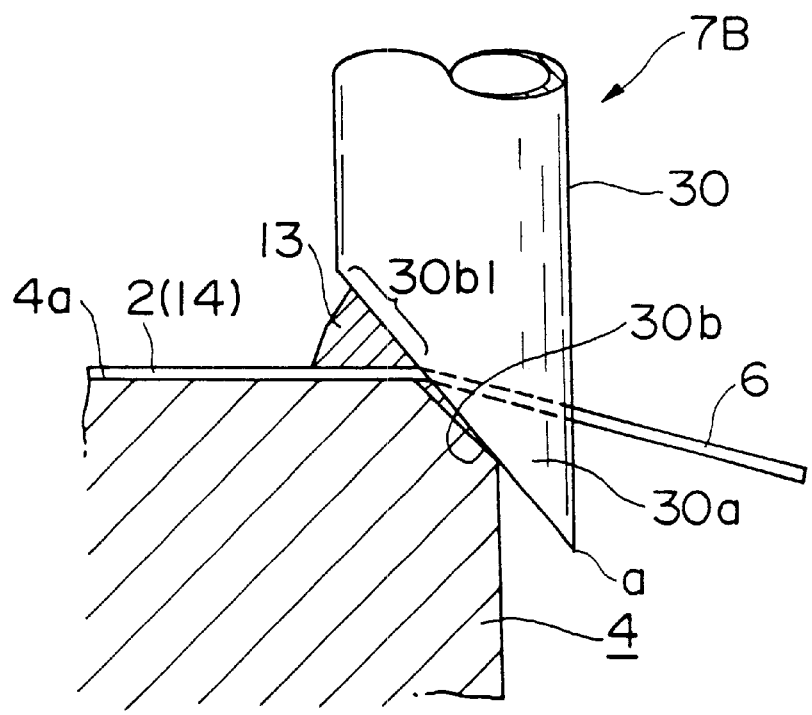
FIG. 14 is an enlarged side view of FIG. 13.

In cutting the thin film 2 by using the pellicle manufacturing jig 7B, the blade 30a is thrust, up to about a half thereof, into the cut-off portion 14 intended to be cut off of the thin film 2, as shown in FIG. 14. A discharging port 30b1 for discharging the coating material 13 is formed between an open end 30b of the pipe 30 and the upper edge 4a of the frame body 4. In order to discharge a fixed amount of the coating material 13 from the discharging port 30b1, a depth of thrust by the blade 30a into the thin film 2 is maintained at a constant length. Further, the discharging port 30b1 is always in a relative relationship with the cut-off portion 14 intended to be cut off from the thin film 2, and the coating material 13 is supplied from above the cut-off portion 14 intended to be cut off.

While maintaining this state, the pipe 30 is moved along the outer edge of the frame body 4 in the same direction as indicated by the arrow mark "a" in FIG. 4. At this time, the discharging port 30b1 is in the relative relationship at all times with the cut-off portion 14 intended to be cut off from the thin film 2, and a fixed amount of the coating material 13 is discharged from above the cut-off portion 14 intended to be cut off. Accordingly, the cut-off portion 14 intended to be cut off is coated with the coating material 13. When the edge 30a moves along the cut-off portion 14 intended to be cut off which is coated with the coating material 13, the unnecessary film 6 which is an unnecessary portion of the thin film 2 is removed, by the edge 30a.

As described above, in cutting off the thin film 2, since the edge 30a cuts off the cut-off portion 14 intended to be cut off which is coated with the coating material 13, even when exceedingly minute dust is produced in the thin film 2 by cutting off, the minute dust is mixed with the coating material 13, and it becomes unable to move due to an adhesive force of the coating material 13. Hence, the minute dust is in a state of being adhered to the cut off portion of the thin film 2. Thus, dropping of the minute dust such as, chops, produced by the edge 30a onto a pattern can be suppressed to the utmost extent. Further, since the unnecessary portion of the thin film 2 protruded from the frame body 4 is removed by the edge 30a which is the physical trimming means, the cutting work can be finished within a short period of time.

Next, examples of the present invention and comparison examples will be described.

EXAMPLE 1

1. Conditions for Carrying Out the Example 1

Place for carrying out the invention: a clean room

Material for the frame body 4: aluminum

Material for the thin film 14: cellulose

Blade 9 used: Design Knife by Olfa Co., Ltd.

Material for the pipe 12: metal or resin

Coating material used: a saturated solution obtained by immersing 4.0 g of Cytop (product name) manufactured by Asahi Glass Co., Ltd., which is a fluorine-containing resin in 46.0 g of CT-Solv.13c (product name) manufactured by Asahi Glass, Ltd., which is a fluorocarbon organic solvent, for five hours at a temperature of 23° C.

Content of the resin: approximately 8% by weight

Discharging amount of the Coating material: 40 μl/minute

Moving conditions of the blade 9: The blade 9 was fitted to an unillustrated orthogonal coordinates-controlled robot hand having a mechanism for rotating the forward end, and then, the blade 9 was moved in a direction indicated by an arrow mark "a" in FIG. 4 along the outer edge of the frame body 4 at a speed of 6 mm/sec.

Number of times of cutting off: 3 times

2. Results of Carrying Out the Example 1

Both a coating width of the coating material 13 and a dripping amount thereof to the outer side surface of the frame body 4 were able to be controlled in less than 1 mm.

Quantity of exceedingly fine dust produced in a step for cutting off the unnecessary film 6 was measured by a particle counter. Measured results are shown in Table 1 in comparison with Comparison Example 1 described below.

Comparison Example 1

The difference in conditions between the Comparison Example 1 and the above Example 1 is only one condition in that, in the Comparison Example 1, the coating material 13 was coated immediately after cutting off of the thin film 2 by the blade 9, and other conditions are the same as in the Example 1.

TABLE 1

|  | 0.3 μm | 0.5 μm | 1.0 μm | 2.0 μm | 5.0 μm | 10.0 μm |
|---|---|---|---|---|---|---|
| Example 1 | 1 | 0 | 0 | 0 | 0 | 0 |
| Comparative Example 1 | 20 | 17 | 6 | 3 | 1 | 1 |

Values shown by the unit μm in Table 1 represent the size of dust, values not having the unit represent the quantity of dust.

For example, it is shown that 1 and 20 pieces of the dust having the size of 0.3 μm are present in the Example 1 and the Comparison Example 1, respectively.

From the Table 1, it is understood that dust is remarkably decreased in the Example 1 in which the coating material was coated before cutting off, in comparison with Comparison Example 1 in which the coating material was coated after cutting off. Particularly, it is noted that there was no dust having a larger size of more than 0.5 μm.

EXAMPLE 2

1. Conditions for Carrying Out the Example 2

The conditions for carrying out the Example 2 were different from that of the Example 1 in that, for the Example 2, the moving speed of the Blade 9 and the content of the resin in a saturated solution were changed. And, in connection with such changes, cutting quality, namely, whether satisfactory or unsatisfactory, was examined.

2. Results of Carrying Out the Example 2

Both a coating width of the coating material 13 and a dripping amount thereof to the outer side surface of the frame body 4 were able to be controlled in less than 1 mm.

Quantity of exceedingly fine dust produced in a step for cutting off the unnecessary film 6 was measured with a particle counter. Measured results are shown in Table 2 in comparison with Comparison Example 2 described below.

Comparison Example 2

In the Comparison Example 2, the pellicle manufacturing jig 7A as shown in FIGS. 7 and 8 was used.

Further, the pipe body 20 has an inner diameter of 0.7 mm.

Still further, for the coating material, a solution containing 3% of the resin was used. Also, cutting off speeds were changed from 2 mm/sec to 6 mm/sec and 10 mm/sec, in step-wise.

TABLE 2

|  | cutting off speed (mm/sec) | resin concentration (%) | resulted state of cutting off |
|---|---|---|---|
| Example 2 | 10 | 3 | good |
|  | 10 | 8 (a saturated solution) | good |
| Comparison Example 2 | 2 | 3 | good |
|  | 6 | 3 | incapable of cutting off |
|  | 10 | 3 | incapable of cutting off |

From the Table 2, it is understood that in the Comparison Example 2, the thin film can be cut off at the cutting off speed of 2 mm/sec, but it cannot be cut off at the cutting off speed of equal to or higher than 6 mm/sec.

On the other hand, in the Example 2, it is understood that it can excellently cut off regardless of whether the solution is in a saturated condition or not, and even at the cut off speed of 10 mm/sec which is the maximum speed in the Comparison Example 2. Accordingly, it can be said that, for cutting the thin film, use of a pellicle manufacturing jig having a blade as in the Example 2 is preferable.

Industrial Applicability

With the present invention, after the thin film has been transferred to a specified frame, a cut-off portion intended to be cut off from the thin film is coated with a coating material before a portion protruded from the frame is removed by a physical cutting means.

Accordingly, even when exceedingly minute dust is produced in the thin film by cutting off, the minute dust is mixed with the coating material, and it becomes unable to move due to an adhesive force of the coating material. Thus, the minute dust is placed in a state of being adhered to the cut off portion of the thin film. Hence, dropping of the minute dust such as, chops, onto the pattern as in the conventional art can be suppressed to the utmost extent. Further, since the protruded portion is removed by a physical trimming means, the cutting work can be finished within a short period of time. Consequently, it is can be said that the present invention is highly valuable in utilization.

While the invention has been described in detail and with reference to specific embodiments thereof, it will be apparent to one skilled in the art that various changes and modifications can be made therein without departing from the spirit and scope thereof.

What is claimed is:

1. A method of manufacturing a pellicle comprising the steps of:

temporarily coating a thin film, which is a constituting member of a pellicle which is a dust cover for a mask used in patterning in manufacturing a semiconductor device or a liquid crystal display plate, on a temporary frame larger than a pellicle frame which is another constituting member of the pellicle;

coating an adhesive on said pellicle frame in advance;

overlapping said temporary frame on said pellicle frame coated with said adhesive;

adhering said thin film which has been temporarily coated on said temporary frame to said pellicle frame by said adhesive;

transferring said thin film coated on said temporary frame to said pellicle frame from said temporary frame; and cutting off a portion of said thin film transferred to said pellicle frame, the portion which is protruded from said pellicle frame, with a physical trimming means, and wherein a coating material, consisting of a saturated solution of an organic solvent and a specified resin saturatedly dissolved therein, said coating material which is a thermo-setting type adhesive or an ultraviolet curing type adhesive which can suppress dust produced in cutting off said thin film and does not remove said dust from said thin film, is supplied to a cut-off portion which is intended to be cut off, by said physical trimming means, at the same time or before cutting off said thin film with said physical trimming means.

2. The method of manufacturing a pellicle as claimed in claim 1, wherein said resin contained in said coating material is immersed in the organic solvent for at least five hours or longer at a temperature in the range of 20–25° C.

3. The method of manufacturing a pellicle as claimed in claim 1, where said saturated solution contains the resin at a ratio of 1–20 parts by weight, based on 100 parts by weight of said organic solvent.

4. The method of manufacturing a pellicle as claimed in claim 1, wherein said resin is a resin material which is identical or similar to the material of said thin film.

5. The method of manufacturing a pellicle as claimed in claim 1, wherein said resin is a resin material selected from the group consisting of a cellulose derivative, silicone resin, an epoxy resin, an acrylic resin, and a fluorine-containing resin.

6. The method of manufacturing a pellicle as claimed in claim 1, wherein said organic solvent is a solvent selected from a ketone solvent or a low fatty acid ester solvent when said resin is a cellulose derivative, silicone resin, an epoxy resin, or an acrylic resin.

7. The method of manufacturing a pellicle as claimed in claim 6, wherein when said resin is a fluorine-containing resin, and a fluoro-solvent is used as the organic solvent.

8. The method of manufacturing a pellicle as claimed in claim 1, wherein said coating material is continuously supplied by means for supplying the coating material attached to or incorporated in said physical trimming means.

9. The method of manufacturing a pellicle as claimed in claim 8, wherein said coating material is applied to said cut-off portion intended to be cut off, by said means for supplying the coating material.

10. A method of manufacturing a pellicle as claimed in claim 8, wherein said coating material is discharged to said cut-off portion intended to be cut off, by said means for supplying the coating material.

11. The method of manufacturing a pellicle as claimed in claim 8, wherein a pipe body is used for said means to supply the coating material.

12. The method of manufacturing a pellicle as claimed in claim 1, wherein when said physical trimming means is moved in a direction for cutting off said thin film, said coating material is supplied at a position where said physical trimming means comes in contact with said thin film or above that position.

13. The method of manufacturing a pellicle as claimed in claim 1, wherein a blade or a needle is used for said physical trimming means.

14. The method of manufacturing a pellicle as claimed in claim 13, wherein said blade has a single edge or a double edge which can cut said thin film along said pellicle frame.

15. The method of manufacturing a pellicle as claimed in claim 13, wherein said needle is a needle with its head obliquely cut.

* * * * *